US006495865B2

(12) United States Patent
Johnson et al.

(10) Patent No.: US 6,495,865 B2
(45) Date of Patent: Dec. 17, 2002

(54) MICROCATHODE WITH INTEGRATED EXTRACTOR

(75) Inventors: Burgess R. Johnson, Bloomington, MN (US); Barrett E. Cole, Bloomington, MN (US); Robert D. Horning, Savage, MN (US); Ulrich Bonne, Hopkins, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/775,098

(22) Filed: Feb. 1, 2001

(65) Prior Publication Data

US 2002/0102753 A1 Aug. 1, 2002

(51) Int. Cl.[7] .......... H01L 29/74
(52) U.S. Cl. .......... 257/164; 257/166; 438/20
(58) Field of Search .......... 438/20; 257/164, 257/165, 166; 313/250, 310, 311

(56) References Cited

U.S. PATENT DOCUMENTS 5,103,145 A * 4/1992 Doran .......... 315/381
6,033,924 A 3/2000 Pack et al. .......... 438/20
6,091,190 A 7/2000 Chalamala et al. .......... 313/346 R
6,100,628 A * 8/2000 Coll et al. .......... 313/310

OTHER PUBLICATIONS

C.A. Spindt, “A Thin–Film Field–Emission Cathode”, J. Appl. Physics, vol. 39, pp. 3504–3505, 1968.
P.R. Schwoebel and C.A. Spindt, “Field–Emitter Array Performance Enhancement Using Hydrogen Glow Discharges”, Appl. Phys. Lett., vol. 63, pp. 33–35.
C.C. Perng, D.A. Crewe, A.D. Feinerman, “Micromachined Thermionic Emitters”, J. Micromech.Microeng., vol. 2, pp. 25–30 (1992).

Kirk Reed Williams, “Micromachined Hot–Filament Vacuum Devices”, Dissertation for Doctor of Phil. in Elec. Eng. and Comp. Sciences, Univ. of Cal., Berkely, Prof. Richard S. Muller, Chair, 1997.

* cited by examiner

*Primary Examiner*—Richard Elms
*Assistant Examiner*—Brad Smith
(74) *Attorney, Agent, or Firm*—Kris T. Fredrick

(57) ABSTRACT

A microcathode which integrates both an electron emitter, or cathode, and an extractor electrode. The electron emitter is attached to the back side of a thin film microstructure on a first surface of a substrate. Electrons are emitted from the electron emitter and into a via extending through the substrate. An electron beam is formed which is pulled through the via and out of the microcathode by an extractor electrode on a second surface of the substrate. The extractor electrode modulates the electron beam current, defines the beam profile, and accelerates the electrons toward an anode located outside of the microcathode. Microcathode of this invention are particularly suitable as electron emitting devices useful for various types of electron beam utilizing equipment such as flat cathode ray tube displays, microelectronic vacuum tube amplifiers, electron beam exposure devices and the like.

57 Claims, 5 Drawing Sheets

MICROCATHODE WITH INTEGRATED EXTRACTOR

BACKGROUND OF THE INVENTION

1. Field of the Invention

The present invention relates to cathode devices. More specifically, the invention relates to thermionic microcathodes having integrated extractor electrodes. According to the invention, a cathode emits electrons into a via through a substrate such that the electrons pass through the entire substrate, then through an aperture in an extractor electrode, and towards an anode. The microcathode device of the invention is particularly suitable for use with various types of electron beam equipment such as flat cathode ray tube displays, microelectronic vacuum tube amplifiers, and other such electron beam exposure devices and the like.

2. Description of the Related Art

It is known in the field of electron beam emitting devices to place a cathode at a negative potential relative to an anode. Typically, with cathode ray tubes or the like, electron emission is achieved by heating the cathode to a sufficiently high temperature that electrons have enough thermal energy to be emitted from the cathode. The potential difference between the cathode and the anode accelerates the emitted electrons from the cathode towards the anode in the form of an electron beam. This technology has been used in various devices, such as cathode ray tube displays, electron microscopes and the like.

One major technical challenge in the field of electron emissions relates to the tendency of emitted electron beams to disperse at an angle on the order of 30 degrees. Such a dispersion spreads the beam over a relatively wide area, resulting in a image display of poor resolution. Many focusing schemes have been proposed to reduce the dispersion of electrons as they traverse the space between the emitting cathode and collecting anodes. See, for example, U.S. Pat. No. 5,070,282 which discloses the use of a negatively biased control electrode which causes electrons to converge toward the axis of the beam. See also U.S. Pat. No. 5,235,244 which discloses a passive dielectric electron beam deflector.

Cathode devices using separate extractor electrodes to provide beam focusing are known in the art. However, when the cathode is smaller than about 1 mm in size, use of a separate extractor electrode presents difficulties in assembly and precise alignment with the cathode. These difficulties result in increased production costs and compromised performance. It would be desirable to devise a more economical microcathode device which integrates both a cathode and an extractor electrode, and which provides simplified fabrication and self-alignment of the cathode and extractor. A smaller device size also provides benefits of lower cathode heater power, lower cost, and application to devices requiring very small cathodes.

The use of extractor electrodes is described in C. A. Spindt, "A Thin-Film Field-Emission Cathode", J. Appl. Physics, Vol. 39, pp. 3504–3505, 1968; P. R. Schwoebel and C. A. Spindt, "Field-Emitter Array Performance Enhancement Using Hydrogen Glow Discharges", Appl. Phys. Lett., vol. 63, pp. 33–35, 1993. Spindt and Schwoebel describe a field emitter microcathode having an aperture grid fabricated from patterned thin films. However, these references greatly differ in arrangement from the present invention, and do not include thermionic cathodes.

Thermionic microcathodes are described in C. C. Perng, D. A. Crewe, A. D. Feinerman, "Micromachined Thermionic Emitters", J. Micromech. Microeng., Vol. 2, pp. 25–30, 1992. Perng et al describes a micromachined narrow tungsten wire which acts as a thermionic microcathode. However, unlike the present invention, Perng et al do not describe the use of an integrated extractor or grid electrode. Furthermore, Perng et al. teach the use of tungsten, which requires much higher temperatures for thermionic electron emission than the materials of the present invention.

The present invention provides a thermionic microcathode which integrates both an electron emitter, or cathode, and an extractor electrode. The electron emitter comprises a low work function material and is attached to the back side of a thin film microstructure which has been formed on a first surface of a substrate. An electron beam is emitted from the electron emitter and into a via which extends through the substrate. The electron beam is pulled through the via and out of the microcathode by an extractor electrode on a second surface of the substrate. The extractor electrode defines the beam profile. By applying a variable voltage to the extractor, it can also modulate the electron beam current and provide a portion of the electric field needed to accelerate the electrons toward the anode located outside of the microcathode. An important advantage of the invention is that it can be fabricated at lower cost than conventional techniques in which the extractor and cathode are fabricated separately and subsequently assembled. Furthermore, the monolithic fabrication of the extractor and cathode on a single substrate allows self-alignment of these components. The invention results in significant cost savings while also enabling the fabrication of smaller and less complicated devices.

SUMMARY OF THE INVENTION

The invention provides a microcathode comprising a planar substrate having first and second opposite surfaces; a substrate via through the substrate which extends through the second surface of the substrate and a distance through the substrate toward the first surface; an electron emitter at a bottom of the via having an electrical connection through the bottom of the via; an extractor electrode at the second surface of the substrate which spans a portion of the via, which extractor electrode has at least one aperture adjacent to the via and opposite to the electron emitter, which extractor electrode is capable of controlling electrons emitted by the electron emitter through the aperture.

The invention further provides a microcathode comprising a planar substrate having first and second opposite surfaces; a plurality of substrate vias through the substrate which extend through the second surface of the substrate and a distance through the substrate toward the first surface; a plurality of electron emitters, one at a bottom of each via, having an electrical connection through the bottom of each via; and an extractor electrode at the second surface of the substrate which spans a portion of each via, which extractor electrode has an aperture adjacent to each via and opposite to each electron emitter, which extractor electrode is capable of controlling electrons emitted by each electron emitter through its corresponding aperture.

The invention still further provides an array of adjacent microcathodes, each microcathode comprising a planar substrate having first and second opposite surfaces; a substrate via through the substrate which extends through the second surface of the substrate and a distance through the substrate toward the first surface; an electron emitter at a bottom of the via having an electrical connection through the bottom of the via; an extractor electrode at the second surface of the substrate which spans a portion of the via, which extractor electrode has at least one aperture adjacent to the via and opposite to the electron emitter, which extractor electrode is capable of controlling electrons emitted by the electron emitter through the aperture.

The invention still further provides a microcathode comprising:

a) a substrate having first and second opposite surfaces;

b) an optional sacrificial material layer on the first surface of the substrate;

c) a thin film microstructure on the first surface of the substrate or on the sacrificial material layer, if present, which thin film microstructure has a back side facing the direction of the substrate and a front side facing away from the substrate;

d) a substrate via through the substrate which via extends through the first and second surfaces of the substrate and the sacrificial material layer, if present, such that the back side of the microstructure faces the substrate via;

e) an electron emitter on the back side of the thin film microstructure such that the electron emitter faces the substrate via;

f) an extractor electrode on the second surface of the substrate and spanning the substrate via, which extractor electrode has at least one aperture adjacent to the substrate via and opposite to the electron emitter, which extractor electrode is capable of controlling electrons emitted by the electron emitter through the aperture.

The invention still further provides a microcathode comprising:

a) a substrate having first and second opposite surfaces;

b) a sacrificial material layer on the first surface of the substrate;

c) a thin film microstructure on the sacrificial material layer, which microstructure has a back side facing the sacrificial material layer on the substrate and an opposite front side facing away from the substrate;

d) a substrate via through the substrate, which via extends through the first and second surfaces of the substrate and through the sacrificial material layer such that the back side of the microstructure faces the substrate via;

e) an electron emitter on the back side of the thin film microstructure facing the substrate via; and f) an extractor electrode on the second surface of the substrate, which extractor electrode has at least one aperture adjacent to the substrate via and opposite to the electron emitter, which extractor electrode is capable of controlling electrons emitted by the electron emitter through the aperture;

wherein the microstructure comprises:

i) an insulator layer on the sacrificial material layer;

ii) an optional electron emitter contact layer on the insulator layer and in contact with the electron emitter;

iii) a heater filament layer on the insulator layer or on the electron emitter contact layer, if present;

iv) an optional additional insulator layer on the heater filament layer; and v) at least two conductive contact pads electrically connected to the heater filament layer.

The invention still further provides a method for forming a microcathode which comprises:

a) providing a substrate having first and second opposite surfaces;

b) forming a sacrificial material layer on the first surface of the substrate;

c) forming a thin film microstructure on the sacrificial material layer, which microstructure has a back side facing the sacrificial material layer on the substrate and a front side facing away from the substrate;

d) forming a substrate via through the substrate which via extends through the first and second surfaces of the substrate and through the sacrificial material layer such that the back side of the microstructure faces the substrate via;

e) forming an electron emitter on the back side of the thin film microstructure facing the substrate via; and f) forming an extractor electrode on the second surface of the substrate, which extractor electrode has at least one aperture adjacent to the substrate via and opposite to the electron emitter, which extractor electrode is capable of controlling electrons emitted by the electron emitter through the aperture;

wherein the microstructure comprises:

i) an insulator layer on the sacrificial material layer;

ii) an optional electron emitter contact layer on the insulator layer and in contact with the electron emitter;

iii) a heater filament layer on the insulator layer or on the electron emitter contact layer, if present;

iv) an optional additional insulator layer on the heater filament layer; and v) at least two conductive contact pads electrically connected to the heater filament layer.

The invention still further provides a method for emitting electrons from a microcathode toward an anode which comprises:

I) providing a microcathode which comprises:

a) a substrate having first and second opposite surfaces;

b) a sacrificial material layer on the first surface of the substrate;

c) a thin film microstructure on the sacrificial material layer, which microstructure has a back side facing the sacrificial material layer on the substrate and an opposite front side facing away from the substrate;

d) a substrate via through the substrate, which via extends through the first and second surfaces of the substrate and through the sacrificial material layer such that the back side of the microstructure faces the substrate via;

e) an electron emitter on the back side of the thin film microstructure facing the substrate via; and f) an extractor electrode on the second surface of the substrate, which extractor electrode has at least one aperture adjacent to the substrate via and opposite to the electron emitter, which extractor electrode is capable of controlling electrons emitted by the electron emitter through the aperture;

wherein the microstructure comprises:

i) an insulator layer on the sacrificial material layer;

ii) an optional electron emitter contact layer on the insulator layer and in contact with the electron emitter;

iii) a heater filament layer on the insulator layer or on the electron emitter contact layer, if present;

iv) an optional additional insulator layer on the heater filament layer; and v) at least two conductive contact pads electrically connected to the heater filament layer; and II) heating the heater filament layer and causing a flow of electrons from the electron emitter through the aperture in the extractor electrode toward an anode and controlling the flow of electrons through the aperture by the extractor electrode.

The invention still further provides a cathode which comprises a support, a metallic electron emitter on the support, which emitter has a layer of a low work function composition, of from about 0 to about 3 electron volts, on the emitter; and which emitter is electrically connected to a voltage source; a heater which is substantially uniformly positioned around and separated from the emitter and which heater is electrically connected to a voltage source.

DETAILED DESCRIPTION OF THE PREFERRED EMBODIMENT

The invention provides a thermionic microcathode having an integrated extractor electrode.

Figure 1:
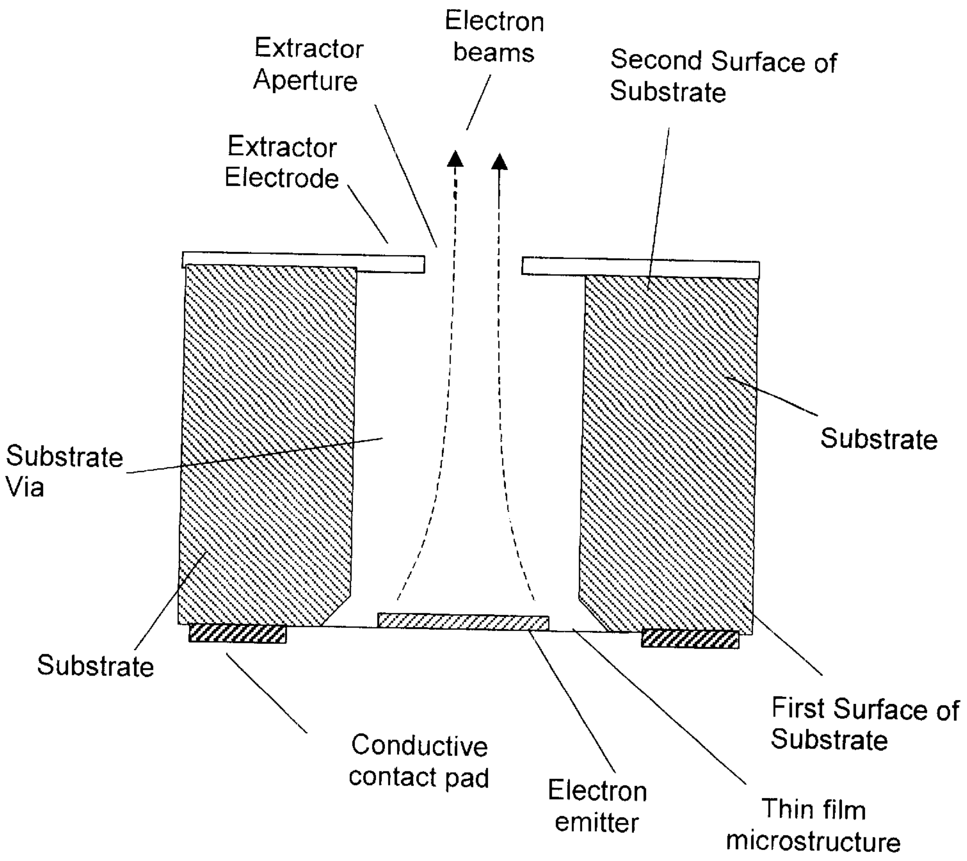
FIG. 1 shows a schematic cross section of the microcathode of the invention, showing a thin film microstructure and electron emitter on a first surface of a substrate, and an extractor electrode on a second surface of the substrate.

FIG. 1 shows first embodiment of the invention where substrate is provided which has first and second opposite surfaces. The substrate is preferably planar, and may comprise conductive or nonconductive materials. Suitable substrate materials nonexclusively include silicon, quartz, sapphire, glass, and mixtures thereof. A preferred substrate according to the invention comprises silicon.

A sacrificial material layer (not shown in FIG. 1) is optionally formed on the first surface of the substrate in order to provide an etch stop during the etch of the substrate via. The sacrificial material layer, if present, may be formed by conventional means, such as depositing by chemical vapor deposition, physical vapor deposition, spin coating, and the like. Thickness of this layer may vary depending on the particular application, but preferably ranges from about 0.1 $\mu$m to about 1 $\mu$m. Suitable materials for the sacrificial material layer nonexclusively include silicon dioxide, aluminum, chromium, polyimide, and combinations thereof. Preferably, the sacrificial layer comprises silicon dioxide.

A thin film microstructure is then preferably formed on the first surface of the substrate, or on the sacrificial material layer, if present. The thin film microstructure serves as a support means, and is preferably capable of supplying thermal or electrical energy to an electron emitter, or cathode, which may be attached to the thin film microstructure as described below.

According to the invention, at least one substrate via is formed through the substrate The substrate via may be formed by any conventional methods such as by wet etching, plasma etching, ion milling, drilling, and the like. Preferably, the substrate via is etched by conventional methods such as deep reactive ion etching, anisotropic wet chemical etching, isotropic wet chemical etching, and the like. According to the invention, deep reaction ion etching is preferred. Preferably, the substrate via is etched such that the via extends through the second surface of the substrate and a distance through the substrate toward the first surface of the substrate. The portion of the via near the first surface of the substrate may be described as the bottom of the via. The substrate via may be etched through the first surface of the substrate. In one embodiment, the substrate via is etched through the first surface of the substrate, terminating at a thin film microstructure or a sacrificial material layer, if present, at the bottom of the via or on the first surface of the substrate. In an alternate embodiment, the substrate via is only etched most of the way through the substrate, leaving a small amount of substrate material intact at the bottom of the via. This small amount of substrate material may then be etched away using an anisotropic etchant, such as KOH, EDP, and the like, to remove the remaining substrate material at the bottom of the via adjacent to the first surface of the substrate. Further etching may optionally be performed to define the shape of the substrate via through the substrate, such as to form wider, angled walls. Portions of the sacrificial material layer, if present, which are adjacent to the substrate via may then be removed by conventional methods such as buffered oxide etching (BOE) or hydrofluoric etching so that the back side of the thin film microstructure faces the substrate via.

At least one electron emitter is then formed at the bottom of the via, and is preferably formed on the back side of the thin film microstructure. The emitter has an electrical connection through the bottom of the via and through the first surface of the substrate. The electron emitter is preferably capable of emitting electrons by any conventional method. Suitable examples of electron emitters nonexclusively include thermionic emitters and field emitters. The electron emitter is preferably positioned such that it faces the substrate via, and such that electrons which are emitted from the electron emitter would be emitted into the substrate via. The electron emitter is also preferably positioned such that it is electrically connected to an energy source, most preferably by means of the thin film microstructure. The electron emitter preferably comprises a conductive material, such as a metal or semiconductor material, which has a layer of a low work function composition or a low work function composition precursor applied thereto. Suitable materials for the conductive material of the electron emitter nonexclusively include nickel, tungsten, platinum, rhodium, platinum silicide, tungsten silicide, and combinations thereof. The low work function composition may include one or more low work function materials having a work function of from about 0 to about 3 electron volts. Such materials are known to those skilled in the art. Suitable low work function materials nonexclusively include barium oxide, barium strontium oxide, lanthanum hexaboride, carbon, diamond-like carbon films, and combinations thereof. The low work function composition may be applied to the conductive material by any conventional means, but is preferably applied by chemical or physical vapor deposition through the extractor aperture or apertures described below.

Figure 4:
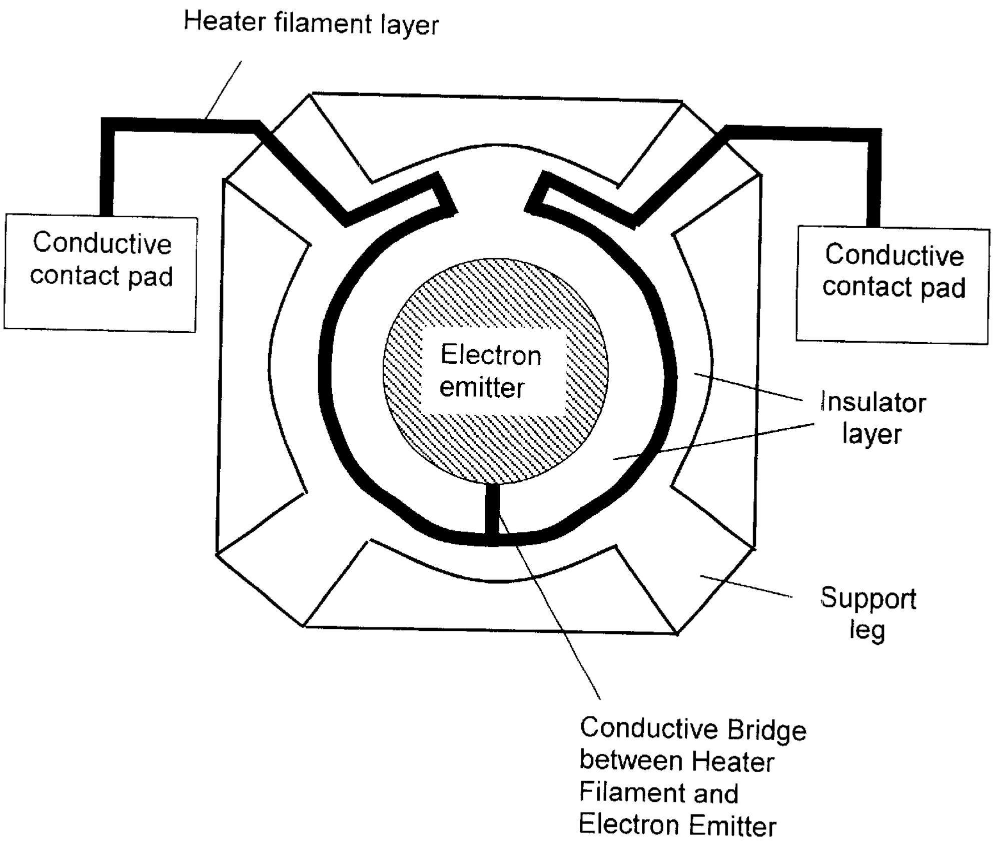
FIG. 4 shows a plan view of a cathode according to the invention.

In one preferred embodiment, shown in FIG. 4, the electron emitter is present as a component of a cathode, which cathode comprises a support, an electron emitter, and a heater. The cathode is preferably about 1 mm or less in all of its linear dimensions. The cathode may also comprise a low work function composition on the heater or on the support, or both on the heater and the support. The support preferably comprises a thin membrane comprising an electrically insulating material. Suitable materials for the thin membrane nonexclusively include silicon dioxide, silicon nitride, or combinations thereof. The heater preferably comprises the materials described above for the heater filament layer of the thin film microstructure. The heater is preferably thermally isolated from an outer periphery of the support. The electron emitter may also be laterally or vertically separated from the heater on the support. The electron emitter may be separated from the heater by an electrically insulating area. The electrically insulating area may comprise an insulator material such as those materials described above for the insulator layer. Most preferably, the heater is substantially uniformly positioned around and separated from the emitter. The emitter is preferably electrically connected to the heater, most preferably at only one point on the heater and at only one point on the emitter. This is shown in FIG. 4 where a conductive bridge connects the heater filament and the electron emitter. In one embodiment, the emitter and the heater are each electrically connected to a voltage source.

An extractor electrode is preferably formed at the second surface of the substrate. The extractor electrode serves to control the electrons emitted by the electron emitter. This may be done by applying an extraction potential to the extractor electrode to thereby contour any emitted electrons into an electron beam. An extraction potential may be applied to the extractor electrode by conventional methods such as by electrically connecting the extractor electrode to a voltage source. Suitable voltage sources are known to those skilled in the art, and may include a power supply, a cathode, or other voltage source.

The extractor electrode preferably spans at least a portion of the substrate via which extends through the second surface of the substrate. The extractor electrode preferably comprises a layer of a conductive material on the second surface of the substrate. which extractor electrode preferably has at least one aperture therethrough, which aperture is adjacent to the substrate via and opposite to the electron emitter. The extractor electrode is preferably capable of controlling electrons emitted by the electron emitter through the aperture. According to the invention, controlling includes modulating and/or focusing the flow of electrons. In one preferred embodiment, a controller circuit is attached to the extractor electrode for controlling a flow of electrons. The shape of the aperture of the extractor electrode may also define the electron beam profile, and hence define the electron current density distribution of an electron beam traveling through the aperture. Suitable materials for the extractor electrode include conductive materials such as metals or semiconductor materials such as silicon doped with boron or phosphorus. Most preferably, when the substrate comprises silicon, the extractor layer comprises a boron-germanium doped epitaxial silicon layer.

Figure 2:
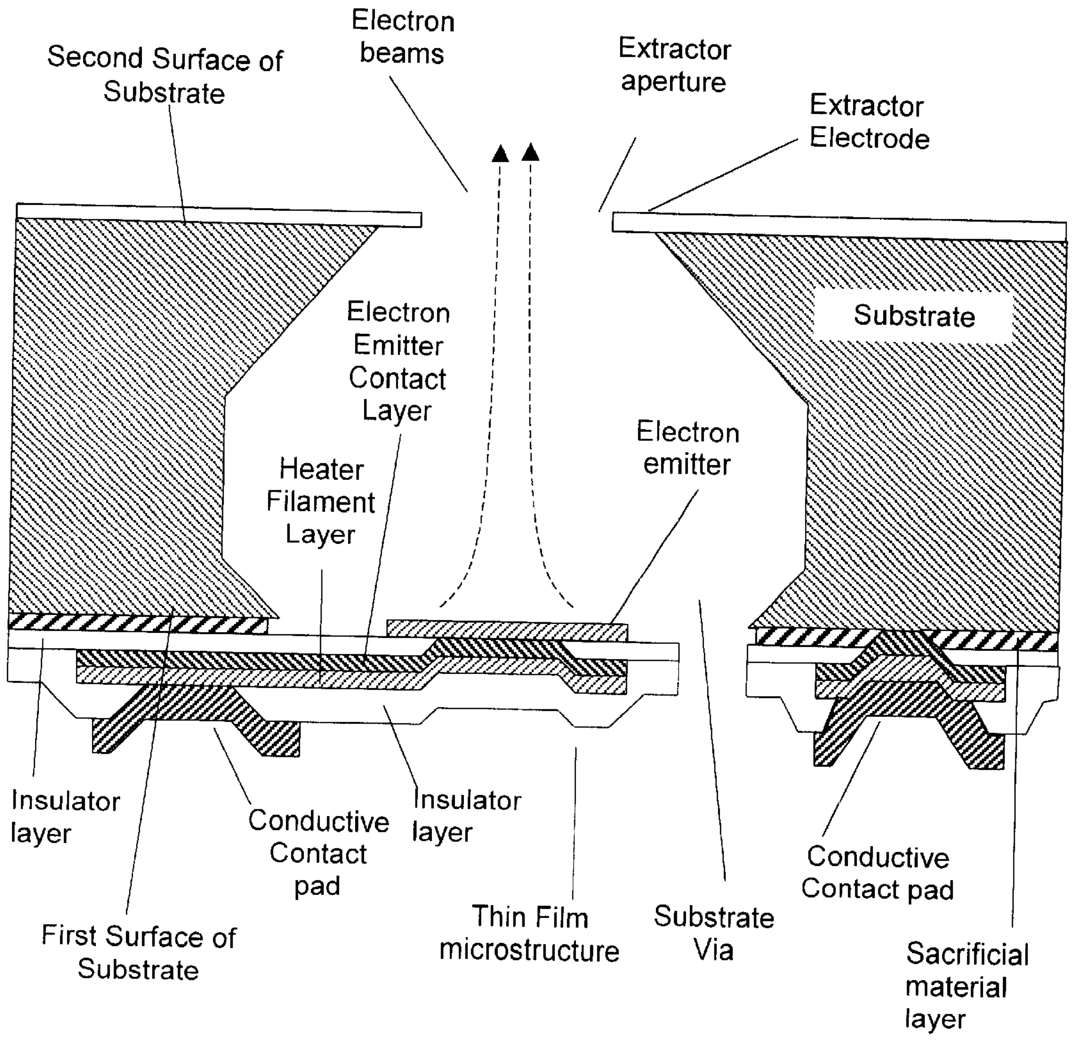
FIG. 2 shows a schematic cross section of the microcathode of the invention, showing a detailed view of the thin film microstructure and electron emitter on a first surface of a substrate, and an extractor electrode on a second surface of the substrate.

FIG. 2 shows a preferred embodiment of the present invention. According to this embodiment, the thin film microstructure comprises an insulator layer on the first surface of the substrate or on the sacrificial material layer, if present, as described above; an optional electron emitter contact layer on the insulator layer and in contact with the electron emitter; a heater filament layer on the insulator layer or on the electron emitter contact layer, if present; an optional additional insulator layer on the heater filament layer; and at least two conductive contact pads electrically connected to the heater filament layer.

The insulator layer is first formed on the first surface of the substrate, or on the sacrificial material layer, if present. The insulator layer provides support and insulation for thermal and electrical connections in and on the thin film microstructure. The insulator layer may be formed by any means such as by depositing an insulator layer material onto the substrate or the sacrificial layer, if present, by conventional means such as chemical vapor deposition (CVD), physical vapor deposition, spin coating, sputtering and the like. Thickness of the insulator layer may vary depending on the particular application, but preferably ranges from about 0.1 $\mu$m to about 2.0 $\mu$m, and most preferably from about 0.5 $\mu$m to about 1.0 $\mu$m when silicon nitride is used. Suitable insulator layer materials nonexclusively include electrically or thermally insulating materials such as undoped silicon, silicon nitride, silicon dioxide, aluminum oxide, and combinations thereof. A preferred insulator layer material comprises silicon nitride, when the substrate comprises silicon.

The insulator layer is then preferably patterned by conventional means to form small contact vias in the insulator layer to allow the formation of electrical connections between other materials of the microstructure. The insulator layer is preferably patterned by plasma etching.

The optional electron emitter contact layer preferably serves as a conductive layer, and may be formed on the insulator layer. In a preferred embodiment, the electron emitter contact layer, if present, serves to electrically connect an electron emitter with a heater filament layer of the thin film microstructure, as described below. The electron emitter contact layer may also be electrically connected to any other conductive material of the thin film structure. The electron emitter contact layer may be formed by any means such as by depositing an electron emitter contact material on the insulator layer by conventional means such as chemical or physical vapor deposition. Thickness of this layer may vary depending on the particular application, but preferably ranges from about 0.05 $\mu$m to about 1.0 $\mu$m, and most preferably from about 0.1 $\mu$m to about 0.5 $\mu$m. Suitable materials for the electron emitter contact layer nonexclusively include metals such as nickel, platinum, tungsten, rhodium, platinum silicide, tungsten silicide, and other conductive metals and semiconductor materials. In a preferred embodiment, the electron emitter contact layer comprises nickel.

The electron emitter contact layer may then be patterned by any conventional means such as by photolithography and ion milling or wet chemical etching. It is preferred that some of the conductive material of the electron emitter contact layer remains in the contact vias which were patterned in the insulator layer.

The heater filament layer is then formed on the insulator layer or the electron emitter contact layer, if present. The heater filament layer serves as a conductive layer of the thin film microstructure. In a preferred embodiment, the heater filament layer provides heat energy to an electron emitter which may be attached to the thin film microstructure as described below. The heater filament layer may be formed by any means such as by depositing heater filament material on the insulator layer or the electron emitter contact layer, if present, by conventional methods known to one skilled in the art. The heater filament layer is most preferably deposited by ion beam sputtering or other chemical or physical vapor deposition methods. The thickness of this layer may vary depending on the particular application, but preferably ranges from about 0.05 $\mu$m to about 2.0 $\mu$m, and most preferably from about 0.05 $\mu$m to about 0.5 $\mu$m. The heater filament layer preferably comprises at least one conductive material. Suitable materials for the heater filament layer nonexclusively include metals such as platinum, tungsten, rhodium, nickel, metal silicides such as platinum silicide and tungsten silicide, and semiconductor materials. Preferably, the heater filament layer comprises platinum.

The heater filament layer is then preferably patterned by conventional means such as ion milling, wet chemical etching, or plasma etching. Preferably, the patterning of this layer is performed by ion milling, when the heater filament layer comprises platinum.

In one preferred embodiment, the heater filament layer serves as a voltage source for the extractor electrode. In this embodiment, the substrate serves as the electrical connection between the heater filament layer and the extractor electrode, provided that the substrate comprises a conductive material having appropriate electrical contacts from the heater filament layer to the substrate and from the substrate to the extractor electrode.

Optionally but preferably, at least one additional insulator layer is formed on the heater electron emitter contact layer or the heater filament layer or both, using the same method as described above. The additional insulator layer is preferably also patterned as described above in order to form conductive contact vias in the additional insulator layer prior to the formation of conductive contact pads, described below. It is preferred that an additional insulator layer is formed and patterned on the heater filament layer. Most preferably, the patterning of the additional insulating layer is done by fluorocarbon plasma etching, which plasma etching stops at the heater filament layer.

Additional vias may optionally be etched through the at least one insulator layer and the sacrificial material layer to the substrate by plasma etching, such as etching with fluorocarbons and oxygen. The presence of these vias serves to decrease the thermal conductance of the substrate, and provides vias for an anisotropic etchant which may be used as described above.

At least two conductive contact pads are then formed on the additional insulator layer, if present, or on the heater filament layer. The conductive contact pads are preferably electrically connected to the heater filament layer, and can provide electrical energy, directly or indirectly, to the heater filament layer. Energy may be supplied to the conductive contact pads by any conventional means known to one skilled in the art. In a preferred embodiment, shown in FIG. 3, energy is supplied to the conductive contact pads by at least two electrical leads. The conductive contact pad is preferably formed by conventional means such as by depositing a conductive contact pad material onto the heater filament layer or the additional insulator layer, if present. In a preferred embodiment, a conductive contact pad material is deposited onto an additional insulator layer having conductive contact vias, to thereby at least partially fill the conductive contact vias with the conductive contact material. The conductive contact pad, typically formed from gold, solder, aluminum or other soft metal material, is preferably sufficiently thick for attachment of wires by conventional wire bonding, soldering or other means well known to one skilled in the art. The conductive contact pad may then preferably be patterned by conventional means. It is most preferred that the conductive contact pad is etched by wet etching.

The invention preferably results in the formation of a microcathode having an integrated extractor electrode which is capable of controlling, i.e. modulating and/or focusing an electron beam current, defining the beam profile, and accelerating electrons toward an anode.

At least one anode is preferably provided, which anode is preferably located outside of the microcathode, such that the extractor is between the electron emitter and the anode.

Figure 3:
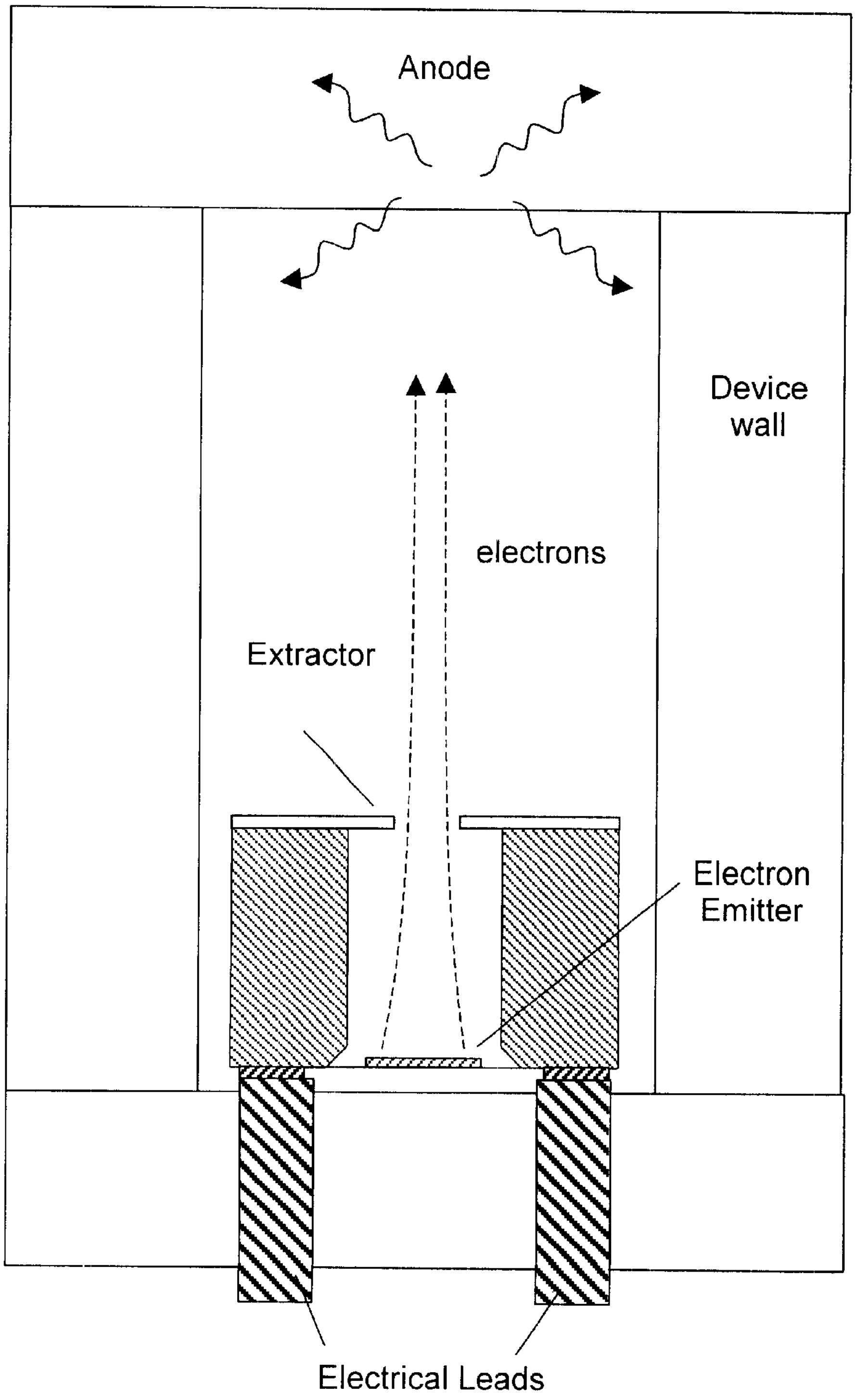
FIG. 3 shows an application of a microcathode according to the invention with electrons directed toward an anode.

FIG. 3 shows a preferred embodiment of the present invention in use. According to this embodiment, a microcathode of the invention is placed in a vacuum atmosphere. Energy is applied to conductive contact pads of the thin film microstructure via electrical leads. Energy flows from the electrical leads, to the conductive contact pads, and to the heater filament layer to thereby heat the heater filament layer. Heat from the heater filament layer flows to an electron emitter contact layer, and then to an electron emitter, causing the emitter to emit electrons into the substrate via. These electrons are electrically pulled toward the extractor electrode due to voltages applied to the extractor electrode and the anode, thus forming an electron beam. The extractor electrode modulates the electron beam and defines the beam profile via the aperture(s) through the extractor electrode. After passing through the extractor aperture(s), the electron beams are accelerated toward the anode located outside of the microcathode.

While the invention includes various embodiments describing a substrate having one microcathode comprising one substrate via and one electron emitter, other embodiments may be preferred such as a microcathode of the invention having a plurality of substrate vias, a plurality of electron emitters, one at a bottom of each via; and an extractor electrode at the second surface of the substrate which spans a portion of each via, which extractor electrode has an aperture adjacent to each via and opposite to each electron emitter, which extractor electrode is capable of controlling electrons emitted by each electron emitter through its corresponding aperture. This embodiment may include other parameters as described above, such as where each substrate via extends through the first surface of the substrate and each electron emitter is supported at a bottom of the via by a thin film microstructure. This embodiment may include a plurality of anodes such that a separate anode would receive electrons emitted by each electron emitter.

Figure 5:
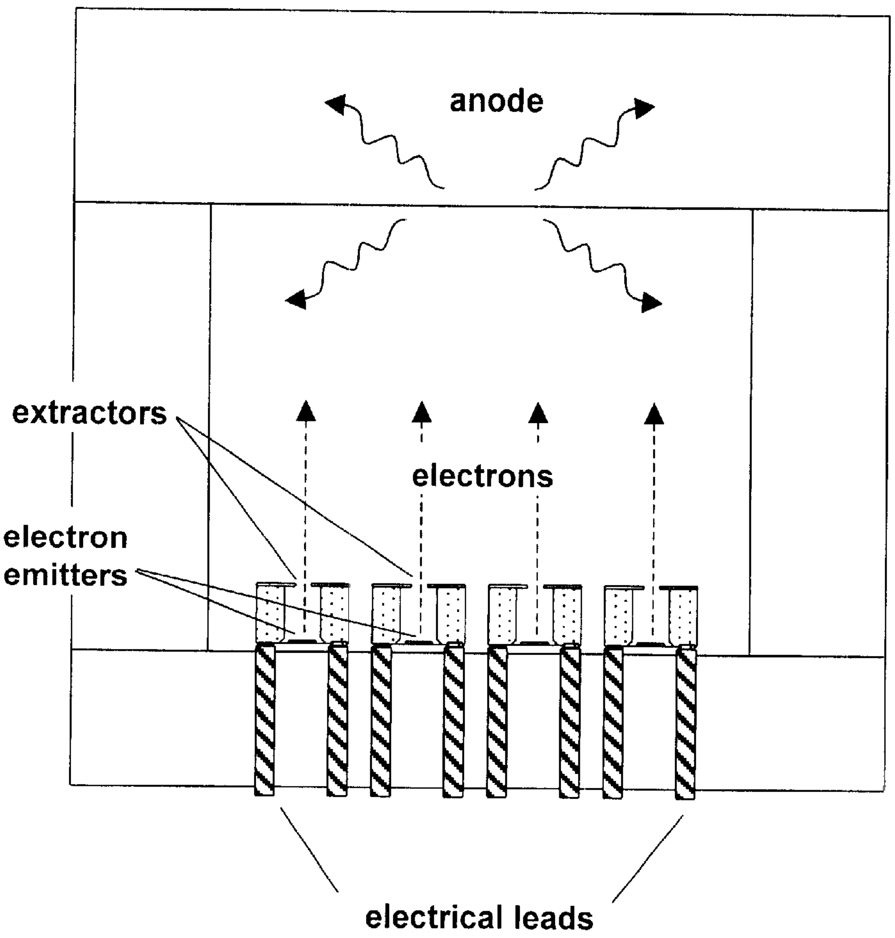
FIG. 5 shows an device having an array of microcathodes according to the invention.

The microcathodes of the invention may be arranged into various arrays. FIG. 5 shows a device having an array of microcathodes according to the invention. Examples of such arrays nonexclusively include arranging a plurality of adjacent microelectrodes according to the invention into a linear array or a planar matrix array.

The microcathodes of the present invention may be used for various purposes such as in an electronic device or the like. Examples of such electronic devices nonexclusively include flat panel displays, amplifiers, and electron beam exposure devices.

The following non-limiting examples serve to illustrate the invention. It will be appreciated that variations in film thicknesses, film compositions, and etching techniques will be apparent to those skilled in the art and are within the scope of the present invention.

EXAMPLE 1

A microcathode is formed by first providing a silicon substrate which is 300 to 500 $\mu$m thick, 4-inch in diameter, low resistivity (~0.001 ohm-cm), double side polished, with high conductivity B:Ge doped epitaxial layer on the second surface of the substrate. A silicon dioxide sacrificial material layer is deposited onto a first surface of the substrate.

A thin film microstructure is then formed on the sacrificial material layer. First, a 0.5 $\mu$m layer of $Si_3N_4$ is deposited onto the sacrificial material layer by sputtering. The $Si_3N_4$ is then patterned to form contact vias. A 0.1 $\mu$m layer of nickel is next deposited as an electron emitter contact layer. The electron emitter contact layer is then patterned to leave nickel in the contact vias. A layer of platinum is next deposited as a heater filament layer by ion beam sputtering.

The platinum is then patterned by ion milling. Another 0.5 $\mu$m layer of $Si_3N_4$ is deposited by sputtering. The $Si_3N_4$ is patterned to form conductive contact vias for the formation of conductive contact pads. This is done by performing a plasma etch, stopping on the platinum heater filament layer. A 1 $\mu$m layer of gold is deposited to form conductive contact pads at the conductive contact vias. The gold conductive contact pads are patterned by wet etching. Vias are etched through the $Si_3N_4$ and the sacrificial material layer to the substrate by plasma etching. This decreases the thermal conductance and provides vias for the anisotropic silicon etchant.

A substrate via is then formed using a timed deep reactive ion etch through the second surface of the substrate and extending most of the way through the substrate (to leave ~50 $\mu$m of silicon). An aperture is thus formed into the second surface of the substrate , which aperture is aligned with the thin film microstructure on the first surface of the substrate, using an infrared aligner.

The inside of the substrate via is then etched using KOH as an anisotropic silicon etchant to remove the remaining substrate material adjacent to the substrate via which is under of the first surface of the substrate to define the shape of the substrate via through the substrate. This etch process exposes a portion of the sacrificial material layer on the first surface of the substrate which is adjacent to the substrate via. This portion of the sacrificial material layer is then removed by buffered oxide etching (BOE) to expose the electron emitter contact layer on the back side of the thin film microstructure.

An electron emitter is provided on the backside of the thin film microstructure, so that the electron emitter faces the substrate via, by deposition of at least a 0.5 $\mu$m layer of $BaCO_3$ by physical or chemical vapor deposition through the extractor aperture onto the nickel emitter contact layer on the backside of the microstructure. The $BaCO_3$ is heated in a vacuum to ~1100° C. by applying electrical current to the heater filament, in order to convert it to BaO, a low work function material.

EXAMPLE 2

Example 1 is repeated except that the substrate via is formed using a deep reactive ion etch through the second surface of the substrate and extending all of the way through the substrate, stopping at the sacrificial material layer on the first surface of the substrate. The sacrificial material layer is removed by buffered oxide etching (BOE), and the remaining steps are conducted as in Example 1 above.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A microcathode comprising a planar substrate having first and second opposite surfaces; a substrate via through the substrate which extends through the second surface of the substrate and a distance through the substrate toward the first surface; a thermionic electron emitter at a bottom of the via having an electrical connection through the bottom of the via; an extractor electrode at the second surface of the substrate which spans a portion of the via, which extractor electrode has at least one aperture adjacent to the via and opposite to the electron emitter, which extractor electrode is capable of controlling electrons emitted by the thermionic electron emitter through the aperture.

2. The microcathode of claim 1 wherein the substrate via extends through the first surface of the substrate and the electron emitter is supported at a bottom of the via by a thin film microstructure.

3. The microcathode of claim 1 comprising a heater for the thermionic electron emitter.

4. A microcathode comprising a planar substrate having first and second opposite surfaces; a plurality of substrate vias through the substrate which extend through the second surface of the substrate and a distance through the substrate toward the first surface; a plurality of thermionic electron emitters, one at a bottom of each via, having an electrical connection through the bottom of each via; and an extractor electrode at the second surface of the substrate which spans a portion of each via, which extractor electrode has an aperture adjacent to each via and opposite to each thermionic electron emitter, which extractor electrode is capable of controlling electrons emitted by each thermionic electron emitter through its corresponding aperture.

5. The microcathode of claim 4 wherein each substrate via extends through the first surface of the substrate and each electron emitter is supported at a bottom of the via by a thin film microstructure.

6. An electronic device which comprises the microcathode of claim 5 and at least one anode for receiving electrons emitted by each electron emitter.

7. The electronic device of claim 6 which is a flat panel display, an amplifier, or an electron beam exposure device.

8. An electronic device which comprises the microcathode of claim 3 and at least one anode for receiving electrons emitted by each electron emitter.

9. The electronic device of claim 8 which is a flat panel display, an amplifier, or an electron beam exposure device.

10. An array of adjacent microcathodes, each microcathode comprising a planar substrate having first and second opposite surfaces; a substrate via through the substrate which extends through the second surface of the substrate and a distance through the substrate toward the first surface; a thermionic electron emitter at a bottom of the via having an electrical connection through the bottom of the via; an extractor electrode at the second surface of the substrate which spans a portion of the via, which extractor electrode has at least one aperture adjacent to the via and opposite to the thermionic electron emitter, which extractor electrode is capable of controlling electrons emitted by the thermionic electron emitter through the aperture.

11. The array of claim 10 wherein the substrate via extends through the first surface of the substrate and the electron emitter is supported at a bottom of the via by a thin film microstructure.

12. An electronic device which comprises the microcathode array of claim 11 and at least one anode for receiving electrons emitted by each electron emitter.

13. The electronic device of claim 12 which is a flat panel display, an amplifier, or an electron beam exposure device.

14. The microcathode of claim 10 comprising a heater for the thermionic electron emitter.

15. The array of claim 10 wherein the microcathodes are arranged in a linear array.

16. The array of claim 10 wherein the microcathodes are arranged in a planar matrix array.

17. An electronic device which comprises the microcathode array of claim 10 and at least one anode for receiving electrons emitted by each electron emitter.

18. The electronic device of claim 17 which is a flat panel display, an amplifier, or an electron beam exposure device.

19. A microcathode comprising:

a) a substrate having first and second opposite surfaces;

b) an optional sacrificial material layer on the first surface of the substrate;

c) a thin film microstructure on the first surface of the substrate or on the sacrificial material layer, if present, which thin film microstructure has a back side facing the direction of the substrate and a front side facing away from the substrate;

d) a substrate via through the substrate which via extends through the first and second surfaces of the substrate and the sacrificial material layer, if present, such that the back side of the microstructure faces the substrate via;

e) a thermionic electron emitter on the back side of the thin film microstructure such that the thermionic electron emitter faces the substrate via;

f) an extractor electrode on the second surface of the substrate and spanning the substrate via, which extractor electrode has at least one aperture adjacent to the substrate via and opposite to the electron emitter, which extractor electrode is capable of controlling electrons emitted by the thermionic electron emitter through the aperture.

20. The microcathode of claim 19 wherein the substrate comprises a material selected from the group consisting of silicon, quartz, sapphire, and glass.

21. The microcathode of claim 19 wherein the substrate comprises silicon.

22. The microcathode of claim 19 wherein the sacrificial material layer comprises a material selected from the group consisting of silicon dioxide, aluminum, chromium, and polyimide.

23. The microcathode of claim 19 wherein the sacrificial material layer comprises silicon dioxide.

24. The microcathode of claim 19 wherein the thin film microstructure comprises:

i) an insulator layer on the first surface of the substrate or on the sacrificial material layer, if present;

ii) an optional electron emitter contact layer on the insulator layer and in contact with the electron emitter;

iii) a heater filament layer on the insulator layer or on the electron emitter contact layer, if present;

iv) an optional additional insulator layer on the heater filament layer; and v) at least two conductive contact pads electrically connected to the heater filament layer.

25. The microcathode of claim 19 wherein the sacrificial material layer is present and the thin film microstructure comprises:

i) an insulator layer on the sacrificial material layer;

ii) an electron emitter contact layer on the insulator layer and in contact with the electron emitter;

iii) a heater filament layer on the electron emitter contact layer;

iv) an additional insulator layer on the heater filament layer; and v) at least two conductive contact pads electrically connected to the heater filament layer.

26. The microcathode of claim 25 wherein the insulator layer comprises a material selected from the group consisting of silicon nitride, silicon dioxide, undoped silicon, and aluminum oxide.

27. The microcathode of claim 25 wherein the insulator layer comprises silicon nitride.

28. The microcathode of claim 25 wherein the electron emitter contact layer comprises a material selected from the group consisting of nickel, platinum, tungsten, and rhodium.

29. The microcathode of claim 25 wherein the electron emitter contact layer comprises nickel.

30. The microcathode of claim 25 wherein the heater filament layer comprises a material selected from the group consisting of platinum, tungsten, rhodium, nickel platinum silicide, and tungsten silicide.

31. The microcathode of claim 25 wherein the heater filament layer comprises platinum.

32. The microcathode of claim 25 wherein the conductive contact pad comprises a material selected from the group consisting of gold, silver, copper and aluminum.

33. The microcathode of claim 25 wherein the conductive contact pad comprises gold.

34. The microcathode of claim 19 wherein the electron emitter comprises a material selected from the group consisting of barium oxide, barium strontium oxide, and lanthanum hexaboride, and carbon.

35. The microcathode of claim 19 wherein the electron emitter comprises barium oxide.

36. The microcathode of claim 19 wherein the extractor electrode comprises boron-germanium doped epitaxial silicon layer.

37. The microcathode of claim 19 further comprising a controller circuit attached to the extractor electrode for modulating and/or focusing a flow of electrons emitted by the electron emitter through the aperture.

38. The microcathode of claim 19 comprising a heater for the thermionic electron emitter.

39. A microcathode comprising:

a) a substrate having first and second opposite surfaces;

b) a sacrificial material layer on the first surface of the substrate;

c) a thin film microstructure on the sacrificial material layer, which microstructure has a back side facing the sacrificial material layer on the substrate and an opposite front side facing away from the substrate;

d) a substrate via through the substrate, which via extends through the first and second surfaces of the substrate and through the sacrificial material layer such that the back side of the microstructure faces the substrate via;

e) an electron emitter on the back side of the thin film microstructure facing the substrate via; and f) an extractor electrode on the second surface of the substrate, which extractor electrode has at least one aperture adjacent to the substrate via and opposite to the electron emitter, which extractor electrode is capable of controlling electrons emitted by the electron emitter through the aperture;

wherein the microstructure comprises:

i) an insulator layer on the sacrificial material layer;

ii) an optional electron emitter contact layer on the insulator layer and in contact with the electron emitter;

iii) a heater filament layer on the insulator layer or on the electron emitter contact layer, if present;

iv) an optional additional insulator layer on the heater filament layer; and v) at least two conductive contact pads electrically connected to the heater filament layer.

40. The microcathode of claim 37 further comprising a controller circuit attached to the extractor electrode for modulating and/or focusing a flow of electrons emitted by the electron emitter through the aperture.

41. A method for forming a microcathode which comprises:

a) providing a substrate having first and second opposite surfaces;

b) forming a sacrificial material layer on the first surface of the substrate;

c) forming a thin film microstructure on the sacrificial material layer, which microstructure has a back side facing the sacrificial material layer on the substrate and a front side facing away from the substrate;

d) forming a substrate via through the substrate which via extends through the first and second surfaces of the substrate and through the sacrificial material layer such that the back side of the microstructure faces the substrate via;

e) forming a thermionic electron emitter on the back side of the thin film microstructure facing the substrate via; and f) forming an extractor electrode on the second surface of the substrate, which extractor electrode has at least one aperture adjacent to the substrate via and opposite to the thermionic electron emitter, which extractor electrode is capable of controlling electrons emitted by the thermionic electron emitter through the aperture;

wherein the microstructure comprises:

i) an insulator layer on the sacrificial material layer;

ii) an optional thermionic electron emitter contact layer on the insulator layer and in contact with the thermionic electron emitter;

iii) a heater filament layer on the insulator layer or on the thermionic electron emitter contact layer, if present;

iv) an optional additional insulator layer on the heater filament layer; and v) at least two conductive contact pads electrically connected to the heater filament layer.

42. The method of claim 41 further comprising a controller circuit attached to the extractor electrode for modulating and/or focusing a flow of electrons emitted by the thermionic electron emitter through the aperture.

43. A method for emitting electrons from a microcathode toward an anode which comprises:

I) providing a microcathode which comprises:

a) a substrate having first and second opposite surfaces;

b) a sacrificial material layer on the first surface of the substrate;

c) a thin film microstructure on the sacrificial material layer, which microstructure has a back side facing the sacrificial material layer on the substrate and an opposite front side facing away from the substrate;

d) a substrate via through the substrate, which via extends through the first and second surfaces of the substrate and through the sacrificial material layer such that the back side of the microstructure faces the substrate via;

e) a thermionic electron emitter on the back side of the thin film microstructure facing the substrate via; and f) an extractor electrode on the second surface of the substrate, which extractor electrode has at least one aperture adjacent to the substrate via and opposite to the thermionic electron emitter, which extractor electrode is capable of controlling electrons emitted by the thermionic electron emitter through the aperture;

wherein the microstructure comprises:

i) an insulator layer on the sacrificial material layer;

ii) an optional thermionic electron emitter contact layer on the insulator layer and in contact with the thermionic electron emitter;

iii) a heater filament layer on the insulator layer or on the thermionic electron emitter contact layer, if present;

iv) an optional additional insulator layer on the heater filament layer; and v) at least two conductive contact pads electrically connected to the heater filament layer; and II) heating the heater filament layer and causing a flow of electrons from the thermionic electron emitter through the aperture in the extractor electrode toward an anode and controlling the flow of electrons through the aperture by the extractor electrode.

44. The method of claim 43 further comprising a controller circuit attached to the extractor electrode for modulating and/or focusing a flow of electrons emitted by the thermionic electron emitter through the aperture and wherein the flow of electrons emitted by the thermionic electron emitter through the aperture is modulated and/or focused by the extractor electrode via the circuit.

45. A cathode which comprises a support, a metallic electron emitter on the support, which emitter has a layer of a low work function composition, of from about 0 to about 3 electron volts, on the emitter; and which emitter is electrically connected to a voltage source; a heater which is substantially uniformly positioned around and separated from the emitter and which heater is electrically connected to a voltage source.

46. The cathode of claim 45 wherein the support comprises a thin membrane.

47. The cathode of claim 45 wherein the support comprises a thin membrane of silicon, silicon dioxide, silicon nitride or combinations thereof.

48. The cathode of claim 45 wherein the low work function material comprises barium oxide, barium strontium oxide, lanthanum hexaboride, carbon films, and combinations thereof.

49. The cathode of claim 45 wherein the emitter comprises nickel, tungsten, platinum, rhodium, platinum silicide, tungsten silicide or combinations thereof.

50. The cathode of claim 45 wherein the heater is thermally isolated from an outer periphery of the support.

51. The cathode of claim 45 wherein the emitter is electrically connected to the heater.

52. The cathode of claim 45 wherein the emitter is electrically connected to the heater at only one point on the heater and at only one point on the emitter.

53. The cathode of claim 45 which is about 1 mm or less in all of its linear dimensions.

54. The cathode of claim 45 further comprising a low work function composition, of from about 0 to about 3 electron volts, on the heater or on the support, or both on the heater and on the support.

55. The cathode of claim 45 wherein the emitter is laterally separated from the heater on the support.

56. The cathode of claim 45 wherein the emitter is vertically separated from the heater.

57. The cathode of claim 45 wherein the emitter is separated from the heater by an electrically insulating area.

* * * * *